(12) United States Patent
Kasai et al.

(10) Patent No.: US 6,924,429 B2
(45) Date of Patent: Aug. 2, 2005

(54) ELECTRONIC DEVICE AND PRODUCTION METHOD THEREFOR

(75) Inventors: Takao Kasai, Tokorozawa (JP);
Makoto Wakasugi, Tokorozawa (JP);
Tsuneji Takasugi, Hannou (JP)

(73) Assignee: Citizen Watch Co., Ltd., Tokyo (JP)

(*) Notice: Subject to any disclaimer, the term of this patent is extended or adjusted under 35 U.S.C. 154(b) by 252 days.

(21) Appl. No.: 10/398,563

(22) PCT Filed: Aug. 16, 2002

(86) PCT No.: PCT/JP02/08322
§ 371 (c)(1),
(2), (4) Date: Apr. 8, 2003

(87) PCT Pub. No.: WO03/017364
PCT Pub. Date: Feb. 27, 2003

(65) Prior Publication Data
US 2004/0017004 A1 Jan. 29, 2004

(30) Foreign Application Priority Data

Aug. 17, 2001 (JP) .................................... 2001-247990
Aug. 17, 2001 (JP) .................................... 2001-248001

(51) Int. Cl.$^7$ ................................................ H05K 5/06
(52) U.S. Cl. ..................................... 174/52.3; 257/704
(58) Field of Search ........................ 174/52.2, 52.3, 174/52.4; 257/704, 703

(56) References Cited

U.S. PATENT DOCUMENTS 4,652,787 A   3/1987  Zingg ........................ 310/344
6,674,159 B1 * 1/2004  Peterson et al. ............ 257/680
6,781,231 B2 * 8/2004  Minervini ................... 257/704
6,809,413 B1 * 10/2004 Peterson et al. ............ 257/680
6,844,606 B2 * 1/2005  Logsdon et al. ............ 257/434

FOREIGN PATENT DOCUMENTS

| JP | 60-187117 | 9/1985 |
| JP | 5-121985 | 5/1993 |
| JP | 11-340350 | 12/1999 |
| JP | 2000-164745 | 6/2000 |
| JP | 2000-236035 | 8/2000 |
| JP | 2002-171150 | 6/2002 |
| JP | 2002-171152 | 6/2002 |

* cited by examiner

Primary Examiner—Hung V. Ngo
(74) Attorney, Agent, or Firm—Finnegan, Henderson, Farabow, Garrett & Dunner, L.L.P.

(57) ABSTRACT

A method for producing an electronic element comprising a housing composed of an insulating ceramic substrate and a lid member covering a surface of the ceramic substrate, with at least one electronic element being mounted inside the housing. After preparing a plate-like ceramic substrate by baking a composite containing inorganic powders and a binder, the ceramic substrate is shaped in accordance with a predetermined design of the device, a metalized layer is formed on a surface of the shaped ceramic substrate, an electronic element is mounted in a predetermined area of the ceramic substrate, and the ceramic substrate is sealed with the lid member.

38 Claims, 10 Drawing Sheets

ELECTRONIC DEVICE AND PRODUCTION METHOD THEREFOR

TECHNICAL FIELD

The present invention relates to a method for producing an electronic device, and more particularly, to a method for producing an electronic device in which a semiconductor element or crystal resonator and so forth is mounted in a ceramic housing. The method of the present invention is particularly useful for producing an electronic device using a multiple production system. The present invention also relates to an electronic device produced by using this production method.

BACKGROUND ART

As is well known, various types of electronic devices have currently been proposed and supplied for practical use. Some examples include IC packages loaded with an IC chip, and crystal oscillators loaded with a crystal resonator. These electronic devices are normally produced by mounting an electronic element in a housing (also referred to as a case or casing) composed of an insulating substrate and its cover, and then sealing the housing. Examples of materials used for the insulating substrate include glass, ceramics, silicon and other inorganic materials.

More recently, multiple production systems have been proposed for producing electronic devices in large volume. The use of such a system makes it possible to simultaneously produce a large number of electronic devices in a single production process by preparing a single large inorganic material substrate, fabricating a large number of housings in that substrate, mounting electronic elements and then individually cutting away the finished electronic devices.

For example, a method for simultaneously producing a large number of piezoelectric vibrators is disclosed in Japanese Unexamined Patent Publication No. 60-187117 by composing a casing by sealing first and second glass substrates each provided with cavities, and then arranging piezoelectric elements inside that casing. According to this production method, after forming a large number of cavities in each glass substrate by chemical etching and then attaching the piezoelectric elements, the second glass plate is superimposed so that corresponding cavities are aligned followed by adhering by heating in a vacuum and sealing. Finally, the two sealed glass substrates are scribed, enabling a large number of piezoelectric vibrators to be obtained by breaking along the scratched lines.

In addition, a method for producing piezoelectric vibrators is also disclosed in Japanese Unexamined Patent Publication (Kokai) No. 5-121985. According to this production method, a large number of piezoelectric vibrators can be obtained by joining a first substrate mounted with a plurality of piezoelectric vibrator pieces and a second substrate in opposition to this substrate to form a joined substrate with the piezoelectric vibrator pieces sealed inside followed by cutting the joined substrates. Silicon wafers or glass substrates are used for the substrates, and selective etching is used to form the cavities for housing the piezoelectric vibrator pieces.

As has been described above, in the case of conventional methods for producing piezoelectric vibrators using a multiple production system, although there are examples of using silicon and glass for the material of the housing in which cavities are formed, examples of the use of ceramics are not widely known. This is because, in order to form a housing from ceramics, since the ceramics must rapidly be processed into the housing or a form close to it in the state of a non-shrunken green sheet prior to baking, and after forming wiring of a high-temperature metal material in a prescribed pattern, must be baked at a high temperature of about 1550-1650° C., dimensional shrinkage of about 20% cannot be avoided. When this degree of dimensional shrinkage is present in the substrate after baking, variations occur in the shape and dimensions of the resulting housing, and a decrease in yield cannot be avoided.

The problem of the dimensional shrinkage described above that occurs in the case of producing housings from ceramics becomes increasingly serious as the size of the substrate after baking becomes larger. For example, although Japanese Unexamined Patent Publication (Kokai) No. 11-340350 proposes a method for forming a plurality of housings by laminating ceramic green sheets and forming a plurality of cavities followed by baking and superimposing an integrated lid corresponding to the location of each cavity to seal the cavities all at once, this method is unable to solve the problem caused by dimensional shrinkage of about 20m% that occurs during baking. In other words, this is because, in order to form a plurality of housings simultaneously, it is necessary to use a greater dimensional margin, and in the case of loading large substrates after baking into a processing device or mounting device for multiple production, continuous index processing is no longer possible due to the poor dimensional accuracy among the plurality of housings.

In order to explain this problem, the following provides an explanation of a method of the prior art for producing crystal vibrators by a multiple production system using ceramics for the substrate material.

First, as is respectively shown in FIGS. 1A and 1B, two types of regular size sheets are prepared. In order to accomplish this, a long green sheet of regular size width is formed from a slurry containing ceramic powder, binder and so forth. A regular size sheet 2b (FIG. 1B) is then blanked and punched from this long sheet to dimensions based on a preset shrinkage factor, and at that time, work reference holes 27 are punched for lamination treatment. Next, cavities 12 for housing electronic elements are punched out using work reference holes 27 of regular size sheet 2b as a reference to form regular size sheet 2a (FIG. 1A). Continuing, a prescribed number of regular size sheets 2a and 2b are laminated and pressed together in predetermined combinations. The lamination step can be carried out by, for example, pressing together for a fixed amount of time at 200-250° C. FIG. 2 indicates a laminated green sheet 2 obtained in this manner. In this drawing, breaking lines 29 fabricated in a later step are also suitably indicated to facilitate understanding.

Next, the resulting laminated green sheet 2 is processed in order as shown in FIGS. 3A through 3E, which are each cross-sectional views taken along lines III—III of FIG. 2.

First, through holes 13 for connecting the top and bottom sides are opened as shown in FIG. 3A using work reference holes 27 of the resulting laminated green sheet 2 as a reference.

Next, as shown in FIG. 3B, top wiring layers 21 and 26, bottom wiring layers 22 and electrical connections 23 are formed in the laminated green sheet 2. To complete this step, a high melting point metal such as W or Mo is filled into through holes 13 opened in the previous step to obtain electrical connections 23. Next, top wiring layers 21 and 26 and bottom wiring layers 22 are formed by applying a coating of a high melting point metal such as W or Mo. Subsequently, notches are made to a depth of about 50% of the thickness of laminated green sheet 2 with a die to form breaking lines 29. Breaking lines 29 are for separating the ceramic substrate in electronic device units during the production process. Subsequently, laminated green sheet 2 is baked at 1550–1650° C. in a hydrogen atmosphere. Dimensional shrinkage of 20% occurs during this baking resulting in the completion of ceramic substrate 2 in which is formed cavities, through holes, wiring layers and breaking lines.

Continuing, ceramic substrate 2 is cut apart at the locations of breaking lines 29. As shown in FIG. 3C, ceramic substrates 2 are obtained each corresponding to units of the desired electronic devices. Namely, this ceramic substrate 2 can be said to be a precursor of the electronic devices.

Next, as shown in FIG. 3D, ceramic substrates 2 are loaded into a carrier (jig) 30 and transported to the final production step shown in FIG. 3E. First, crystal resonator 1 is mounted in cavity 12 formed in ceramic substrate 2. In order to perform this mounting, an electrically conductive paste 24 is coated onto wiring layer 21 on ceramic substrate 2, and crystal resonator 1 is mounted followed by heating. For example, the heating temperature is about 180° C. when the electrically conductive paste is a thermosetting resin containing Ag.

After crystal resonator 1 has finished being mounted, a lid member.("kovar" is used here) 3 is superimposed on the upper surface of ceramic substrate 2 and sealed to be airtight. In order to perform this airtight sealing, after arranging a foil-shaped low-temperature metal brazing material (an Au—Sn alloy brazing material is used here) at the joined locations of ceramic substrate 2 to form junction layer 25, ceramic substrate 2 and lid member 3 are brazed by means of junction layer 25. Crystal vibrator 1 fabricated in this manner is then shipped to the market following final inspection.

However, the above production method and other production methods based on a multiple production system have numerous problems. For example, although a plurality of cavities are formed on a ceramic substrate, since the positional accuracy of each cavity is poor, a plurality of lid members are unable to be simultaneously integrated into a single unit, thereby making it necessary to mount the electronic elements and seal the lid members after separating the cavities into individual units and loading into a jig, and increasing the complexity of the production process. In addition, there is also the problem of cuttings falling into the cavities when each of the cavities are separated into individual units, as well as the problem of debris falling into the cavities at the stage the ceramic substrate containing cavities is loaded into the jig.

DISCLOSURE OF THE INVENTION

In order to solve the technical problems of the prior art as described above, an object of the present invention is to provide a production method capable of producing various types of electronic devices, including crystal vibrators and crystal oscillators, both easily and in good yield in a multiple production system by composing the housing that houses the electronic elements from ceramics.

Another object of the present invention is to provide a method for producing such electronic devices that prevents cuttings and debris from falling into cavities.

Another object of the present invention is to provide various types of electronic devices, including crystal vibrators and crystal oscillators, capable of being produced in a multiple production system despite the housing that houses its electronic elements being formed from ceramics.

These and other objects of the present invention will be able to be easily understood from the following detailed explanation.

The present invention, in one of its aspects, is a method for producing an electronic device comprising a housing composed of an insulating ceramic substrate and a lid member covering a surface of the ceramic substrate, with at least one electronic element being mounted inside the housing; comprising:

a step wherein, after preparing a plate-like ceramic substrate by baking a composite containing inorganic powders and a binder, a shaped ceramic substrate is formed by shaping the ceramic substrate in accordance with a predetermined design of the device, a step wherein a metalized layer is formed on a surface of the shaped ceramic substrate, a step wherein an electronic element is mounted in a predetermined area of the shaped ceramic substrate, and a step wherein the ceramic substrate having mounted thereon the electronic element is sealed with the lid member.

In this production method, the metalized layer is also preferably formed on the area of the surface of the shaped ceramic substrate that is contacted with the lid member.

In addition, in another aspect, the present invention is a method for producing an electronic device comprising a housing composed of an insulating ceramic substrate and a lid member covering a surface of the ceramic substrate, with at least one electronic element being mounted inside the housing; comprising:

a step wherein, after preparing a large, plate-like ceramic substrate, having a size capable of ultimately supplying a plurality of the electronic devices, by baking a composite containing inorganic powders and a binder, a large, shaped ceramic substrate is formed by shaping the large ceramic substrate in accordance with a predetermined design of the device, a step wherein a metalized layer is formed on a surface of the large, shaped ceramic substrate, a step wherein electronic elements are mounted in a predetermined area of the large, shaped ceramic substrate, a step wherein a plurality of electronic devices are produced by sealing the large ceramic substrate having mounted thereon the electronic elements with the lid member, and a step wherein the electronic devices are individually separated from the large ceramic substrate.

In this production method as well, the metalized layer is also preferably formed on the area of the surface of the large, shaped ceramic substrate that is contacted with the lid member.

Moreover, in still another aspect, the present invention is a method for producing an electronic device comprising a housing composed of an insulating ceramic substrate and a lid member covering a surface of the ceramic substrate, with at least one electronic element being mounted inside the housing; comprising:

a step wherein, after preparing a large, plate-like ceramic substrate, having a size capable of ultimately supplying a plurality of the electronic devices, by baking a composite containing inorganic powders and a binder, a shaped ceramic substrate is formed by framing unit substrates within the large ceramic substrate and shaping each of the unit substrates in accordance with a predetermined design of the device, a step wherein the unit substrates are cut away from the large ceramic substrate, a step wherein a metalized layer is formed on a surface of the unit substrates, a step wherein an electronic element is mounted in a predetermined area of the unit substrates, a step wherein electronic devices are produced by sealing the unit substrates in which the electronic element is mounted with the lid member, and a step wherein the electronic devices are individually separated from the unit substrates.

In this production method, it is preferable that the unit substrates are framed by providing provisional reference positions at a portion of the large ceramic substrate, a plurality of the unit substrates are framed within the large ceramic substrate, and/or the metalized layer is also formed on an area of the surface of the unit substrates that is contacted with the lid member.

These methods for producing an electronic device are particularly preferably carried out in the manner described below.

(1) The metalized layer should be formed by coating a thick film conductive paste on a surface of the ceramic substrate, large ceramic substrate or unit substrates followed by baking.

(2) In the shaping step, at least one through hole that passes through the substrate and/or at least one cavity for loading an electronic element should be formed at a predetermined location of the ceramic substrate, large ceramic substrate or unit substrates.

(3) Electrical connections should be formed for connecting the electronic element with an external element and so forth by carrying out metalization by filling a thick film conductive paste into the through holes followed by baking.

(4) A paste having Ag for its main ingredient should be used for the thick film conductive paste.

(5) A plating layer should be additionally formed on the metalized layer.

(6) Sealing by the lid member should be carried out through a junction layer composed of a low-temperature metal brazing material or low melting point glass formed on a surface of the ceramic substrate, large ceramic substrate or unit substrates.

(7) Au—Sn alloy, Au—Ge alloy, Au—Si alloy or Ag—Ge alloy in the form of a foil or paste should be used for the low-temperature metal brazing material.

Moreover, in still another aspect, the present invention is an electronic device comprising a housing composed of an insulating ceramic substrate and a lid member covering a surface of the ceramic substrate, with at least one electronic element being mounted inside the housing; wherein, the ceramic substrate of the housing is composed of a plate-like ceramic substrate formed by baking a composite containing inorganic powders and a binder, the ceramic substrate is provided with at least one electrical connection for connecting the electronic element with an external element and so forth, the electrical connection is formed by metalization by filling a thick film conductive paste into a through hole formed by shaping that passes through the ceramic substrate after baking the ceramic substrate followed by baking, a metalized layer is provided on a surface of the ceramic substrate that is formed by baking the thick film conductive paste after baking the ceramic substrate, and the ceramic substrate and lid member are welded through a junction layer composed of a low-temperature metal brazing material or low melting point glass formed on the ceramic substrate.

In the electronic device of the present invention, the electronic element is preferably mounted in a cavity formed by shaping the ceramic substrate after baking the ceramic substrate.

In addition, the thick film conductive paste is preferably composed of a paste having Ag for its main ingredient. Moreover, a plating layer is preferably additionally provided on the metalized layer formed from a thick film conductive paste. The low-temperature metal brazing material is preferably an Au—Sn alloy, Au—Ge alloy, Au—Si alloy or Ag—Ge alloy in the form of a foil or paste.

Here, an explanation is provided of the terms used in the specification of the present application. The term "electronic element" is used in the broad sense, and includes semiconductor elements such as IC chips, LSI chips or VLSI chips, components such as capacitors, resistors or contactors as well as crystal resonators and so forth normally mounted in electronic devices. In addition, in the case the term "electronic device" is used in the specification of the present application, it refers to various devices in which electronic elements are used, such as semiconductor devices, crystal vibrators and crystal oscillators. Namely, provided the present invention can be applied effectively, there are no restrictions on the types of electronic devices and the electronic elements mounted therein. Moreover, a "green sheet" does not necessarily refer to a shaped product obtained by the wet doctor blade method, but refers to all unbaked products in the form of sheets produced upon molding of a composite comprising inorganic powders and a binder.

BEST MODE FOR CARRYING OUT THE INVENTION

Figure 1A:
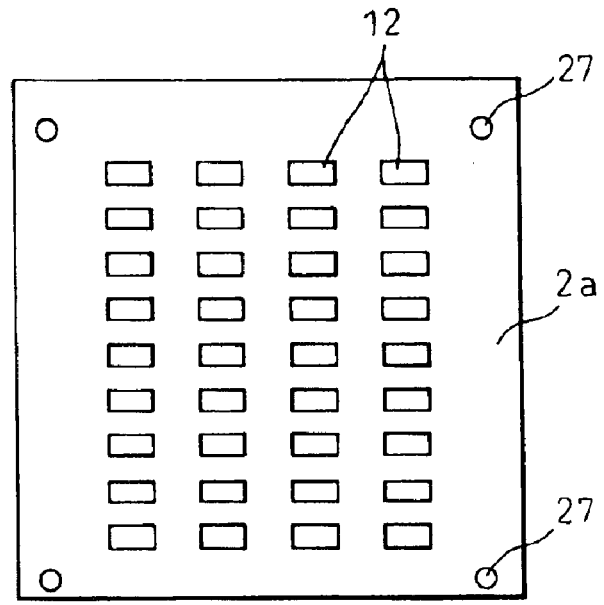
FIGS. 1A and 1B are each overhead views of a regular size sheet used in the production of a crystal vibrator of the prior art.
Figure 1B:
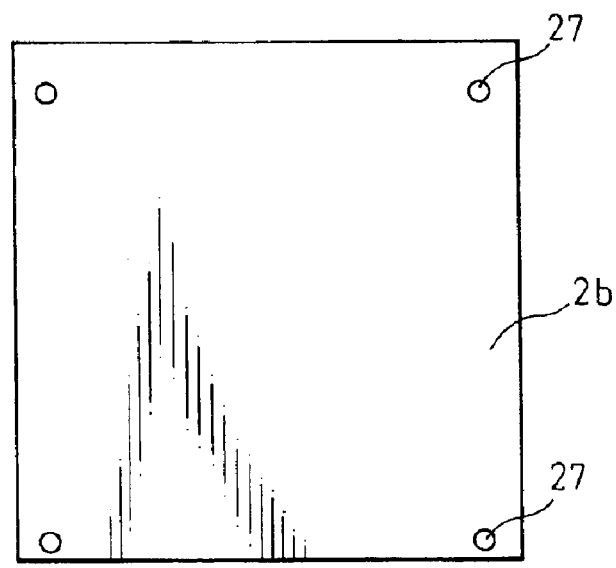
Figure 2:
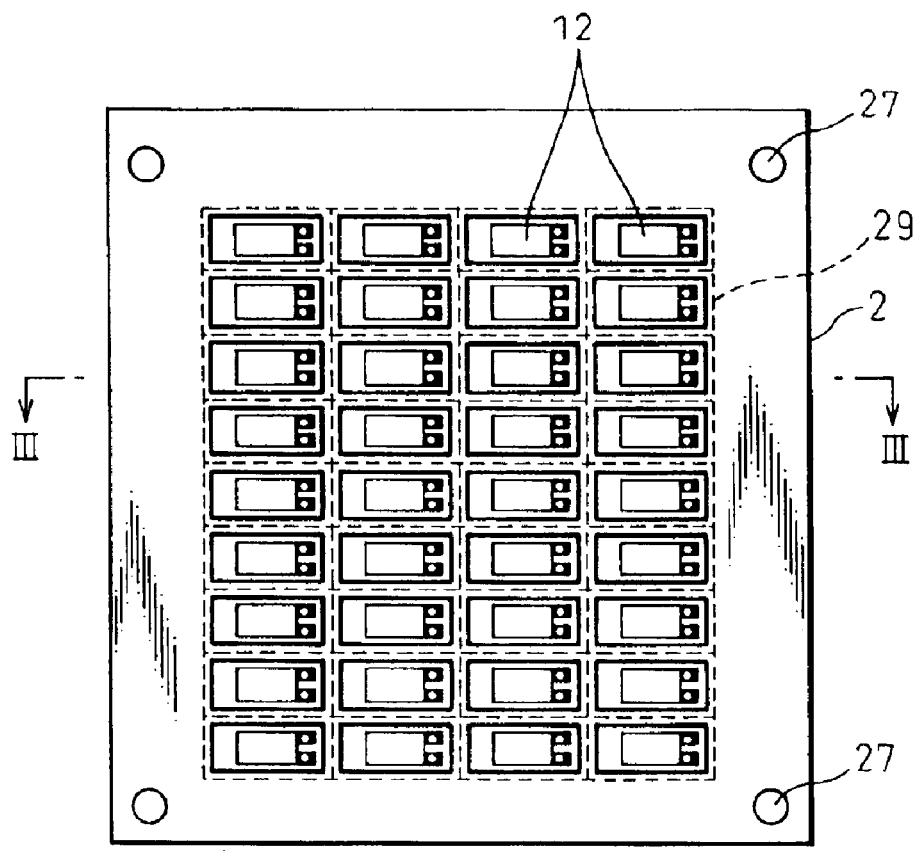
FIG. 2 is an overhead view of a laminated green sheet produced by laminating regular size sheets.
Figure 3A:
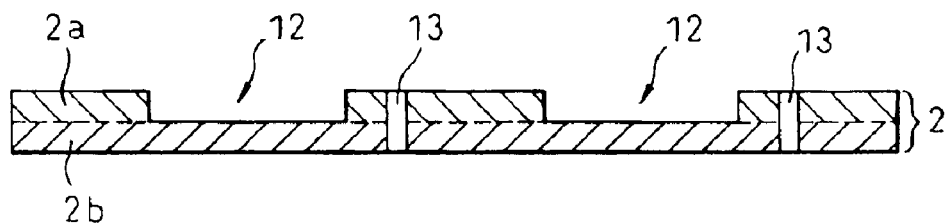
FIGS. 3A through 3E are cross-sectional views showing the order of the steps of a method of the prior art for producing a crystal vibrator using the laminated green sheet of FIG. 2.
Figure 3B:
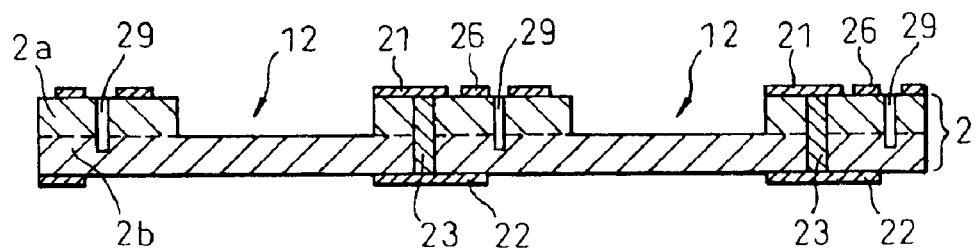
Figure 3C:
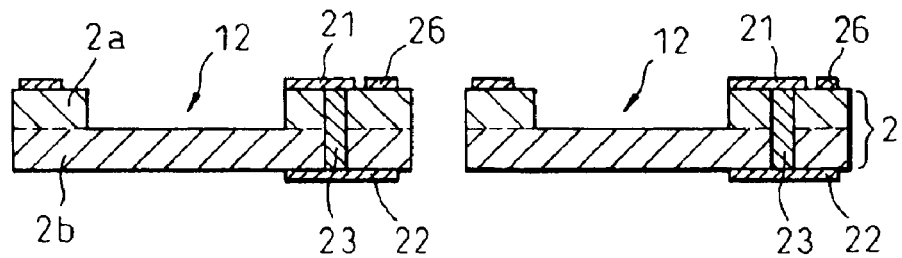
Figure 3D:
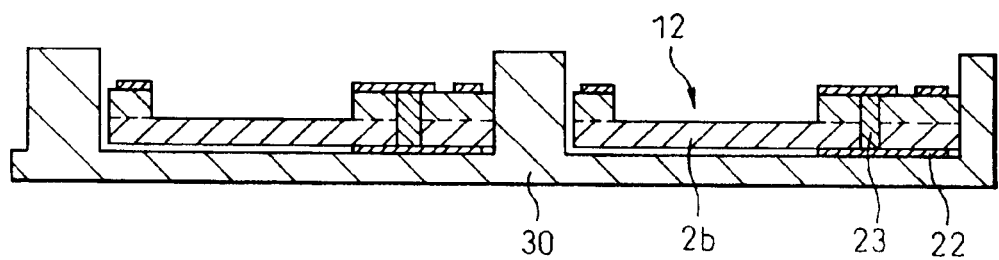
Figure 3E:
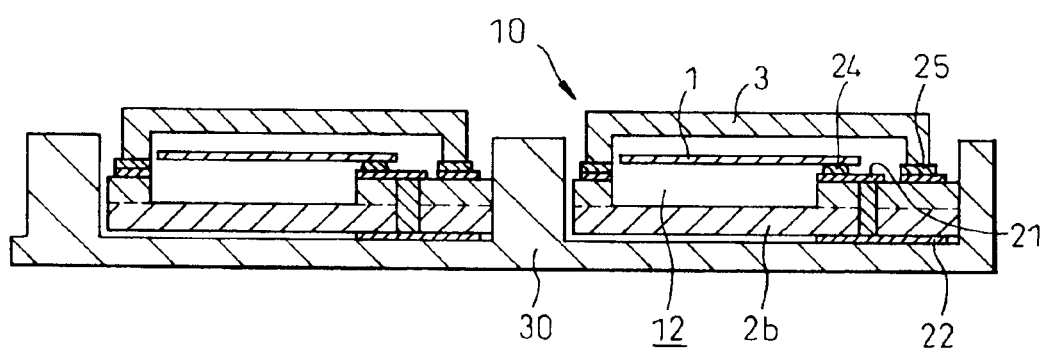

The production method of an electronic device and electronic device according to the present invention can each be advantageously carried out in various forms.

As previously described, although an electronic device produced by the method of the present invention includes various types of electronic devices, its housing is basically composed of an insulating substrate and a lid member that covers a surface of that insulating substrate. In addition, the housing is typically provided with cavities (or so-called containers) having an adequate shape and dimensions for housing electronic elements in order to house at least one electronic element inside. The cavities are normally defined by an indentation formed to a prescribed depth in the substrate surface, and the bottom surface of the lid member that covers it so as to seal it inside. Alternatively, the cavities may also be defined by a plate-like substrate and a frame having an opening in the center that is superimposed on that substrate. The bottom surface of the lid member may be flat, or it may have indentations of a prescribed depth at the areas corresponding to the indentations of the substrate, a single cavity may be formed by combining both indentations. If indentations are present in both the top surface of the substrate and bottom surface of the lid member, since electronic elements can be arranged in nearly the center of the cavities formed by them, there is the advantage of being able to prevent the electronic elements from inadvertently making contact with the cavity inner walls.

In providing an additional explanation of the housing of the electronic device, the insulating substrate that composes one side of the housing is a plate-like ceramic substrate. Examples of ceramic materials used as the substrate material include, but are not limited to, alumina, mullite, cordierite and glass ceramics. Alumina and glass ceramics are particularly preferable as substrate materials.

Although the ceramic substrate can be produced by press molding, extrusion molding or the doctor blade method and so forth, normally in order to produce a ceramic substrate having a large surface area, a production method is used in which a green sheet is molded from a slurry containing raw material inorganic powders, binder and so forth followed by baking this slurry. The doctor blade method is preferably used to mold the green sheet, and the inorganic powders used at that time are powders of substrate materials like those mentioned above normally having a particle diameter of about 0.3–0.6 μm. After preparing a slurry by mixing these ceramic powders with a binder such as polyvinylbutyral (PVB) or other organic binder, plasticizer, solvent and so forth, the slurry is processed into a green sheet. Although the thickness of the green sheet can be varied over a wide range corresponding to the molding conditions used and so forth, it is normally about 100–300 μm. Next, the required number of resulting green sheets are laminated to obtain a laminate having a thickness corresponding to the desired ceramic substrate. Thus, the number of green sheets laminated can be varied according to their thickness and the thickness of the ceramic substrate. In addition, in determining the optimum number of green sheets laminated, it is preferable to take into consideration that the dimensions of the laminate can be shrunk normally by about 20% in the subsequent baking step.

After preparing a laminate from green sheets according to the doctor blade method as described above, the process moves to the baking step. Namely, in the method of the present invention, it is not necessary to form cavity indentations or through holes in a soft laminate followed by baking as in the method of the prior art, and substrate deformation and variations in dimensional accuracy can be prevented. The baking step can be carried out in accordance with ordinary methods by placing the prepared laminate in a baking oven. Here, an oxidizing atmosphere is preferably applied in the case of alumina ceramics. The baking temperature is normally within the range of about 1550–1650° C. The baking temperature may be lower or higher than this temperature range as necessary. The thickness of the ceramic substrate obtained by baking is normally about 300–500 μm.

The ceramic substrate preferably has cavities in its surface. These cavities are formed in the surface of the substrate after finishing baking of the ceramic substrate in the manner described above. Although there are no particular restrictions on the forming method used to form the cavities, examples of methods that can be used include laser trimming and honing. The shape and size of cavities formed in this manner can be varied over a wide range corresponding to the details of the electronic elements, design of the electronic device and so forth, and their depth is normally about 0.03–0.1 mm.

Electronic elements are mounted in the cavities of the ceramic substrate. As was previously described, the electronic elements include semiconductor elements, crystal resonators and so forth. Although normally only one of these elements is mounted in a cavity, depending on the design of the electronic device, two or more electronic devices may be mounted in combination or mounted mutually independently. In addition, additional elements required to complete the electronic device, such as various components, may also be mounted within the cavities by utilizing their open areas in particular, and wiring layers, electrodes and other components may also be arranged.

In addition, the cavities of the ceramic substrate are also preferably provided with internal wiring and so forth for connecting the electronic elements to external elements and so forth (and are generically referred to as "electrical connections" in the specification of the present application). These electrical connections are preferably provided on the ceramic substrate particularly for simplifying the production process. This is because these electrical connections can be formed simultaneously with the wiring layer by forming through holes in the substrate simultaneously with the step in which cavity indentations are formed in the substrate, or in a different step, followed by preferably filling a thick film conductive paste into those through holes followed by baking and metalization. The thick film conductive paste is preferably an Ag/Pd paste that is the same as that used for forming the wiring layer.

Electronic elements like those described above can then be arranged by forming a wiring pattern in a prescribed pattern in the surface and so forth of the ceramic substrate followed by connecting the electronic elements to that wiring pattern. The wiring pattern can preferably be formed by coating a thick film conductive paste in a prescribed pattern followed by baking to obtain a metalized layer. For the thick film conductive paste, a metal paste having Ag as its main ingredient, such as Ag, Ag/Pt or Ag/Pd paste, or various types of metal pastes such as Cu paste or Au paste, is preferably used according to the particular application, with Ag/Pd paste being particularly useful. Although being able to be varied over a wide range, the thickness of the wiring layer is normally about 5–30 μm, and preferably about 10–20 μm.

There are no particular restrictions on the lid member used in combination with the ceramic substrate to form the housing, and it may be in the form of a flat plate or in the form of a box provided with indentations in a plate. The size of the lid member is able to comply with the ceramic substrate described above, and its thickness is normally about 0.1–1.0 mm, and preferably about 0.05–0.20 mm. In addition, there are also no particular restrictions on the material used to form the lid member, and may be formed from, for example, kovar (Fe/Ni/Co alloy), 42% Ni—Fe alloy, ceramics or other metal material. Alternatively, a lid member in which the brazed junctions are not metalized with a thick film conductive paste may be formed from an insulating material such as glass ceramics. This lid member may also be formed to have a wiring layer as necessary.

In the electronic device of the present invention, its housing is formed by integrating the ceramic substrate and lid member into a single unit by welding with a low-temperature metal brazing material, and is preferably sealed to be airtight. Welding of the ceramic substrate and lid member can be carried out advantageously by placing the lid member on the ceramic substrate so that the bottom surface of the lid member makes contact with a wiring layer already formed on its top surface, and preferably with a wiring layer resulting from metalization of a thick film conductor paste, followed by brazing the contacting surfaces via a junction layer composed of a low-temperature metal brazing material. Brazing of the low-temperature metal brazing material can be carried out in accordance with ordinary methods.

Examples of brazing materials that can be used for the low-temperature metal brazing material for forming the junction layer include Au—Sn alloy, Au—Ge alloy, Au—Si alloy and Ag—Ge alloy in the form of foils or pastes. Although being able to be varied over a wide range, the thickness of the junction layer is normally about 5–25 μm.

In addition, it is recommended to make various improvements in the joined structure of the ceramic substrate and lid member in order to enhance their joining strength. For example, a junction layer like that described above is preferably provided after additionally forming a plating layer on the wiring layer obtained by metalization of a thick film conductor paste. An electroless plating layer of Ni and Au, for example, is useful for the plating layer. Such a plating layer is effective for protecting the brazed surfaces and joined surfaces during processing, improving the wettability with the low-temperature metal brazing material, and enhancing corrosion resistance. In addition, although being able to be varied over a wide range, the thickness of this plating layer is normally about 3 μm or more in the case of an electroless Ni layer, and about 0.05–1 μm in the case of an Au layer.

The electronic device according to the present invention can be produced by using various techniques. Preferably, the electronic device of the present invention can be advantageously produced by fabricating a plate-like ceramic substrate from its raw materials by going through a series of processing such as lamination and baking, followed by forming a metalized layer composed of a thick film conductor paste on a surface of this ceramic substrate, and welding the metalized layer of the ceramic substrate and a lid member by means of a low-temperature metal brazing material.

The electronic device of the present invention can be particularly advantageously produced by carrying out the following steps in order. Furthermore, when the details of each step have already been explained, their explanation will not be repeated. In addition, each step may also be carried out in a different order as necessary.

(1) Formation of Ceramic Substrate

A plate-like ceramic substrate is formed by forming a green sheet by press molding, extrusion molding or the doctor blade method and so forth followed by baking said green sheet.

(2) Formation of Cavities

Cavities for housing electronic elements are formed in a surface of the ceramic substrate. In addition, through holes and other processed sections for forming electrical connections are formed either simultaneously with or before or after formation of the cavities.

(3) Formation of Metalized Layer

A metalized layer is formed by coating a thick film conductive paste on a surface of the ceramic substrate in a predetermined pattern followed by baking. In this case, if there are through holes in the ceramic substrate, the thick film conductive paste may be filled into those through holes and baked and formed together with the electrical connection layer prior to forming the metalized layer.

In addition, although welding of the ceramic substrate and lid member can be advantageously carried out via a junction layer formed in a subsequent step, a plating layer, and preferably an electroless plating layer of Ni and Au, can preferably be formed on the previously formed metalized layer. This is because this plating layer serves to improve corrosion resistance, while also allowing the obtaining of enhanced joining strength between the ceramic substrate and lid member.

(4) Mounting of Electronic Elements

Electronic elements are mounted in the cavities formed in the ceramic substrate. Ordinary techniques may be employed for the mounting method. For example, an electronic element can be mounted by means of a conductive paste on a wiring layer of the ceramic substrate. In addition, examples of mounting methods other than those using a conductive paste include BGA and brazing.

(5) Formation of Junction Layer

The junction layer is formed by arranging a low-temperature metal brazing material at the location of the junction of the ceramic substrate and/or lid member.

(6) Welding Ceramic Substrate and Lid Member

The ceramic substrate and lid member are welded with the junction layer interposed between. As a result, the target electronic device is obtained. The resulting electronic device is then normally supplied to a final inspection.

The electronic device of the present invention may be produced by single production or multiple production. The electronic device of the present invention is advantageously produced by multiple production, and the effect of the present invention can be maximally demonstrated by being produced in that manner. Namely, the electronic device of the present invention is based on a consistent process extending from the fabrication of a large-sized ceramic substrate by going through a series of processing such as lamination and baking, followed by forming cavities for housing electronic elements in the surface of that ceramic substrate, to the forming of electrical connections, mounting of electronic elements and sealing of the cavities with a lid member, followed finally by individually separating the plurality of electronic devices formed on the ceramic substrate.

The method for producing an electronic device of the present invention can be particularly advantageously used to produce an electronic device by carrying out the following steps in order. Furthermore, when the details of each step have already been explained, their explanation will not be repeated. In addition, each step may also be carried out in a different order as necessary.

(1) Formation of Ceramic Substrate

A long or standard size green sheet is formed by press molding, extrusion molding or the doctor blade method and so forth. Since this green sheet is used for producing multiple electronic devices, it is at least required to have a size that is sufficient for that purpose. Next, two or more green sheets are laminated to obtain a laminate of a prescribed thickness. The laminate is then normally baked at about 1550–1650° C. in a oxidizing atmosphere to obtain the target plate-like ceramic substrate accompanied by dimensional shrinkage of about 20%.

(2) Framing of Unit Substrates and Formation of Cavities

Unit substrates are framed on the surface of the ceramic substrate based on its external dimensions. Although there are no particular restrictions on the number of unit substrates framed here, the number is normally two or more. In addition, together with the framing of these unit substrates, cavities for housing electronic elements, through holes for forming electrical connections and breaking lines for separating the electronic device from the ceramic substrate in the final stage are formed on the surface of the ceramic substrate. These forming steps can be carried out by laser trimming, honing and so forth.

(3) Cutting of Unit Substrates

After the cavities and so forth have finished being formed in the manner described above, each of the unit substrates provided with cavities and so forth are cut away from the ceramic substrate. This cutting step can be carried out using an ordinary slicer and so forth.

(4) Metalization

Metalization is carried out by providing reference positions at portions of the unit substrates that have been cut away. Two sides on the outer circumference adjacent to the unit substrates are normally used for the reference positions. First, in order to carry out metalization, together with filling a thick film conductive paste into the through holes of the unit substrates, thick film conductive paste is also coated onto the surface of the unit substrates in a predetermined pattern. Next, the thick film conductive paste is baked at about 850–900° C. in an oxidizing atmosphere. A metalized layer (wiring pattern, electrode pattern and so forth) and electrical connection layer (internal wiring) are then formed on each unit substrate.

In addition, although welding of the unit substrate and lid member can be advantageously carried out via a junction layer formed in a subsequent step, even more preferably, a plating layer, and preferably an electroless plating layer of Ni and Au, can be formed on the metalized layer (wiring pattern) already formed. This plating layer serves to improve the corrosion resistance of the brazing surfaces and joining surfaces during processing as well as improve the wettability with the low-temperature metal brazing material, thereby making it possible to obtain enhanced joining strength between the two.

(5) Mounting of Electronic Elements

Electronic elements are mounted in the cavities formed in the unit substrates. Ordinary techniques may be employed for the mounting method. For example, electronic elements can be mounted by attaching one end of an electronic element after coating a conductive paste such as a thermosetting resin containing Ag onto the wiring layer on a unit substrate, and heating at about 280° C. In addition, examples of mounting methods that do not use a conductive paste include BGA and brazing.

(6) Sealing of Unit Substrate Cavities with Lid Member

After forming a junction layer by arranging the low-temperature metal brazing material at locations where the unit substrates and/or lid member are joined, the unit substrates and lid member are welded via that junction layer. The brazing material may be foil, paste and so forth. In addition, the junction layer may be formed from a substance other than brazing material depending on the materials of the unit substrates and lid member. Electronic devices are obtained in which the cavities are sealed to be airtight, and a plurality of electronic elements are contained therein.

(7) Separation of Electronic Devices

The electronic devices are separated from the unit substrates along the preformed breaking lines. This separation step can also be carried out using an ordinary slicer and so forth. Each of the separated electronic devices are normally supplied to a final inspection.

EXAMPLES

Next, a more detailed explanation is provided of the prevention invention through its examples. It should be noted, however, that the examples indicated here are only for indicating examples of the present invention, and do not limit the present invention in any way.

Figure 4:
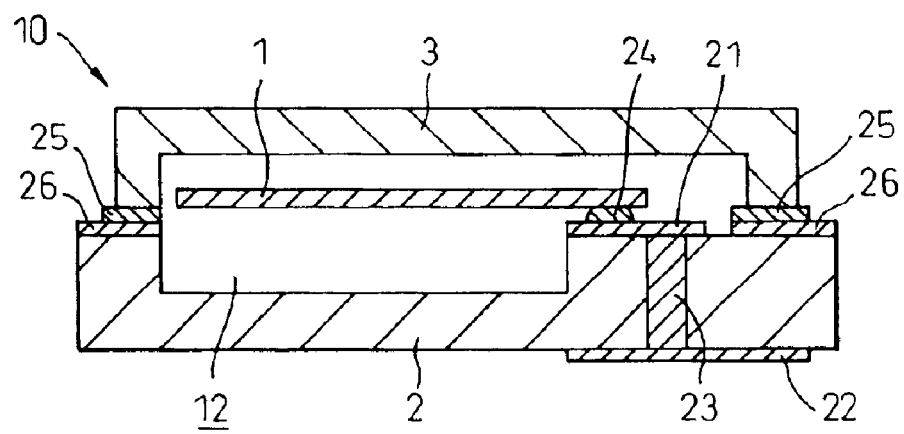
FIG. 4 is a cross-sectional view showing a preferable example of a crystal vibrator according to the present invention.

FIG. 4 is a cross-sectional view showing a preferable mode of a crystal vibrator produced according to the method of the present invention. Crystal vibrator 10 is provided with a housing composed of a plate-like ceramic substrate 2 and a lid member 3 made of kovar (Fe/Ni/Co alloy) that covers its surface. Ceramic substrate 2 is produced by baking a green sheet obtained by molding a slurry containing alumina as the main raw material. A rectangular cavity 12 is formed in the surface of ceramic substrate 2. A crystal resonator 1 is mounted in the space defined by the inner space of cavity 12 and box-shaped lid member 3. One end of crystal resonator 1 is attached via a conductive paste 24 on a wiring layer 21 formed on the surface of ceramic substrate 2. As shown in the drawing, the edge of wiring layer 21 is trimmed so as to not have electrical continuity with lid member 3. In addition, this wiring layer 21 is connected to a wiring layer 22 formed on the bottom surface of ceramic substrate 2 (top surface of the housing) via internal wiring 23 formed passing through ceramic substrate 2. Wiring layers 21, 22 and 26 are formed by coating a thick film conductive paste on the surface of ceramic substrate 2 followed by baking (metalization), while internal wiring 23 is formed by filling a thick film conductive paste into through holes formed in ceramic substrate 2 followed by metalizing in the same manner. The thick film conductive paste used here is an Ag/Pd paste. In addition, although not shown in the drawing, a plating layer, such as a Ni+Au electroless plating layer, may be provided on a wiring layer formed from this thick film conductive paste.

As shown in the drawing, ceramic substrate 2 and lid member 3 are welded via junction layer 25 composed of wiring layer 26 and a low-temperature metal brazing material sequentially formed on ceramic substrate 2. The low-temperature metal brazing material used here is a brazing material comprised of 20% Sn—Au. In addition, a paste having a similar composition may be used instead of this brazing material.

Figure 5:
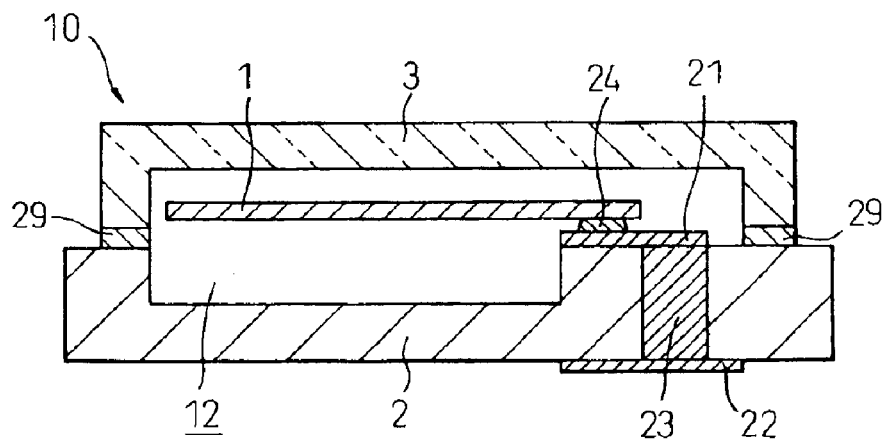
FIG. 5 is a cross-sectional view showing another preference example of a crystal vibrator according to the present invention.

FIG. 5 shows a variation of the crystal vibrator shown in FIG. 4. In this crystal vibrator 10, ceramic substrate 2 and lid member 3 made of soda glass are welded via a junction layer 29 comprised of low melting point glass formed on ceramic substrate 2. The remainder of the constitution is basically the same as the crystal vibrator of FIG. 4.

Figure 6:
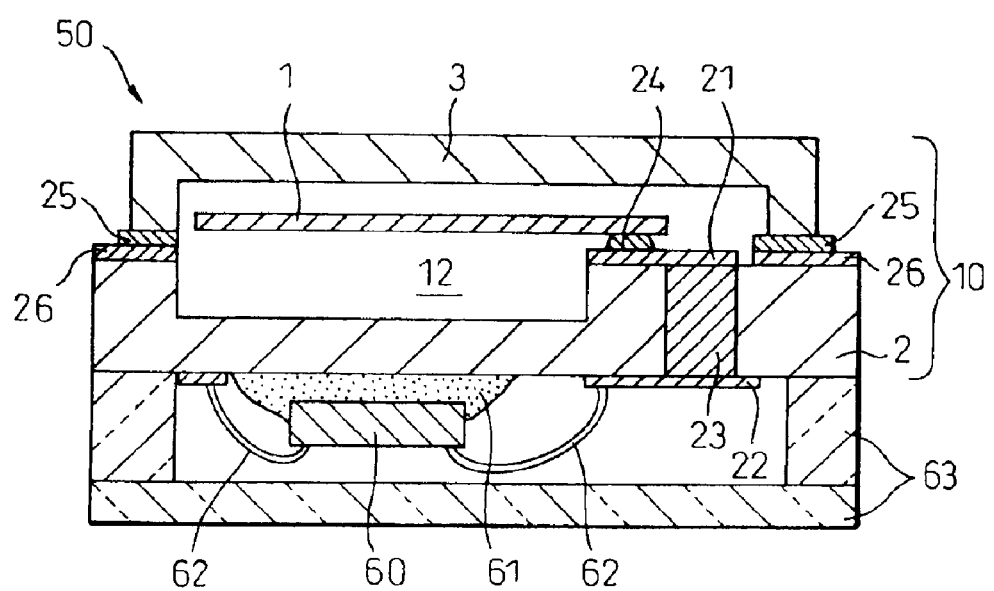
FIG. 6 is a cross-sectional view showing a preferable example of a crystal oscillator according to the present invention.

FIG. 6 is a cross-sectional view showing a preferable mode of a crystal oscillator as an electronic device according to the present invention. As shown in the drawing, crystal oscillator 50 is provided with crystal vibrator 10 previously explained with reference to FIG. 4, while also having an IC chip 60 mounted on the bottom surface of its ceramic substrate 2. IC chip 60 is sealed on the substrate by a polyimide resin 61, and is connected to a wiring layer 22 via bonding wires 62. A lid member 63 is used to seal the device to be airtight.

In addition, FIGS. 7A through 7F show the order of the steps of a method for producing the crystal vibrator shown in FIG. 4 according to the present invention.

Step (A): Formation of Ceramic Substrate

A slurry is prepared having the composition indicated below.

| Ceramic powder: Alumina (particle diameter: 0.4 $\mu$m) | 100 parts by weight |
|---|---|
| Binder, plasticizer, dispersant: Polyvinylbutyral (PVB), oleic acid | 2.5 parts by weight |
| Solvent: Methyl ethyl ketone (MEK) | 55 parts by weight |

Figure 7A:
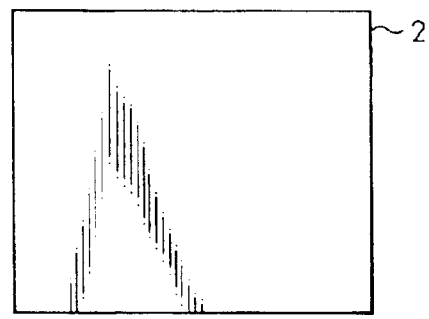
FIGS. 7A through 7F are cross-sectional views showing the order of the steps of a method for producing a crystal vibrator of the present invention by a multiple production system.

Long and regular size green sheets having a width of 250 mm, length of 250 mm and thickness of 130 $\mu$m are formed from this slurry using the doctor blade method. After punching each of the green sheets so as to have post-baking outer dimensions of 200 mm wide×200 mm long, a total of four green sheets are laminated and baked for about 2 hours at about 1550–1650° C. in an oxidizing atmosphere. A plate-like ceramic substrate having a thickness of 400 $\mu$m is obtained as shown in FIG. 7A.

Step (B): Framing of Unit Substrates and Cavity Formation

Figure 7B:
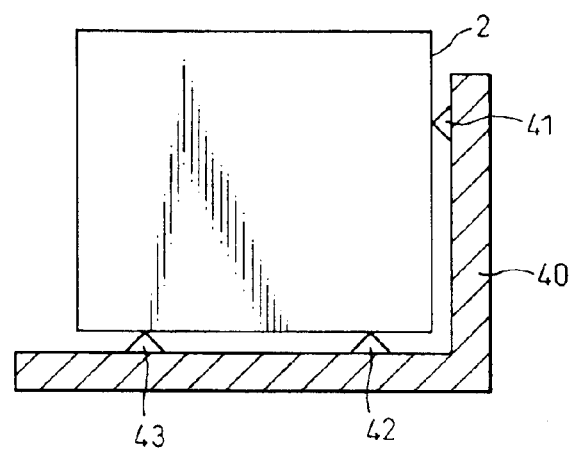
Figure 7C:
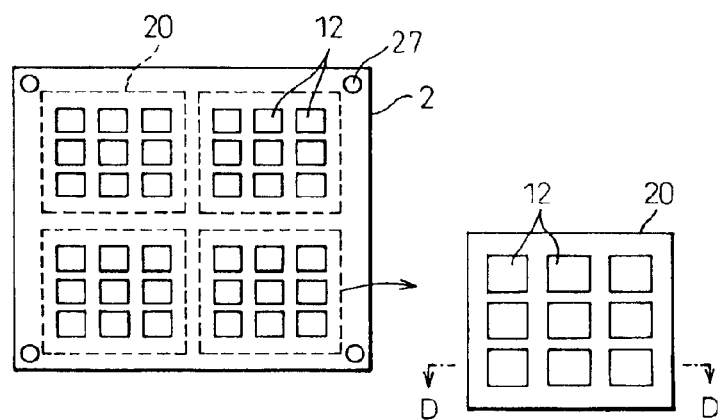

As shown in FIG. 7B, provisional reference positions (not shown) provided in ceramic substrate 2 are pushed against positioning projections 41, 42 and 43 of a framing jig 40 to fix ceramic substrate 2. Next, as shown in FIG. 7C, four unit substrates 20 are framed. Furthermore, the numbers of work reference holes and unit substrates may be varied arbitrarily. In addition, a plurality of cavities 12 (nine cavities 12 are shown in the drawing) are formed by laser drilling in each unit substrate 20. In addition, simultaneous with the formation of these cavities 12, through holes (not shown) for forming internal wiring are formed by laser trimming. The hole diameter of through holes 13 is about 100 $\mu$m. Moreover, breaking lines (not shown) for separating the finished products from the unit substrates are also formed by making notches in the ceramic substrate to about 50% of its thickness.

Step (C): Separation of Unit Substrates

After forming cavities and so forth in each unit substrate as described above, each of the unit substrates having a plurality of cavities 12 are sliced and separated from ceramic substrate 2 as shown in FIG. 7C.

Step (D): Formation of wiring Layers and the like

Figure 7D:
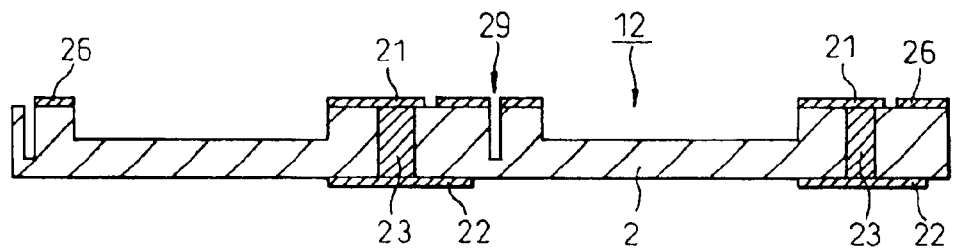

As shown in FIG. 7D, which is a partially enlarged cross-sectional view taken along line D—D of unit substrates 20 shown in FIG. 7C, after filling Ag/Pd thick film paste into the through holes (area corresponding to reference symbol 23), the same Ag/Pd paste is coated onto both the top and bottom surfaces of ceramic substrate 2 at a thickness of 30 $\mu$m in a predetermined pattern. Subsequently, the Ag/Pd thick film paste is baked for about 1 hour at about 850° C. in an oxidizing atmosphere. Wiring layers 21, 22 and 26 along with internal wiring 23 are formed composed of metalized layers. Furthermore, reference symbol 29 indicates a breaking line for separating the final products that is formed in a previously step.

Moreover, although not shown in the drawings, an electroless plating layer such as that comprised of Ni+Au is preferably formed on each of wiring layers 21, 22 and 26 formed in the manner described above. These plating layers are effective for protecting the brazed surfaces and joined surfaces from corrosion during processing as well as improving the wettability with the low-temperature metal brazing material.

Step (E): Mounting of Crystal Resonators

Figure 7E:
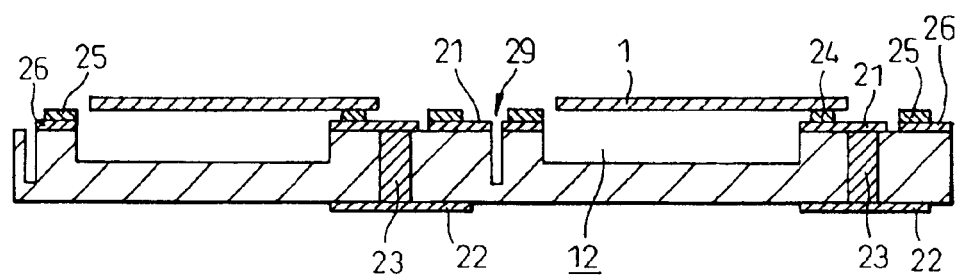

As shown in FIG. 7E, a crystal resonator 1 is mounted on wiring layer 21 of ceramic substrate 2. A conductive paste (thermosetting resin containing Ag) 24 is coated at a prescribed site on wiring layer 21 and on one end of crystal resonator 1, followed by curing treatment at about 180° C. Furthermore, the frequency of the crystal vibrator is adjusted at this stage.

Step (F): Welding of Ceramic Substrate and Lid Member

Figure 7F:
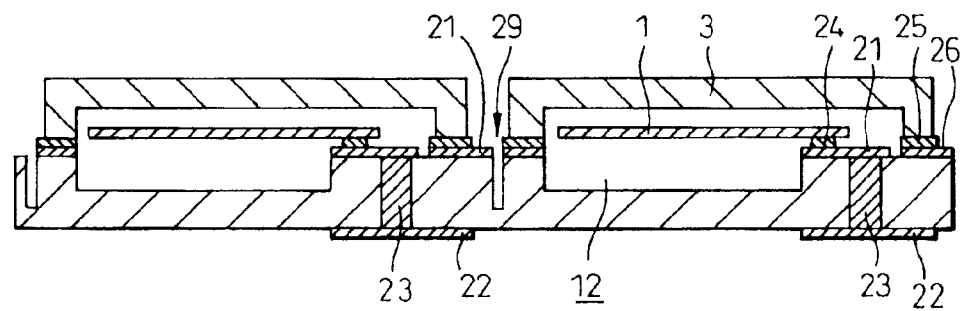

As shown in FIG. 7F, after forming a junction layer 25 by arranging a low-temperature metal brazing material (Au—Sn brazing material) at the position where the lid member joins ceramic substrate 2, ceramic substrate 2 and lid member 3 made of covar are welded by brazing via junction layer 25. Crystal vibrator 10 is obtained that is sealed to be completely airtight. In this example, a total of nine crystal resonators are fabricated in a single unit substrate.

After fabricating nine crystal resonators in each of the unit substrates by going through the series of steps described above, the crystal vibrators are sliced along breaking line 29 and separated. Finally, final inspections are performed on each of the crystal vibrators.

The crystal vibrator shown in FIG. 4 can also be advantageously produced by a single product production system as explained below in order with reference to FIGS. 8A through 8G.

Step (A): Formation of Ceramic Substrate

A slurry is prepared having the composition indicated below.

| Ceramic powder: Alumina (particle diameter: 0.4 $\mu$m) | 100 parts by weight |
|---|---|
| Binder, plasticizer, dispersant: Polyvinylbutyral (PVB), oleic acid | 2.5 parts by weight |
| Solvent: Methyl ethyl ketone (MEK) | 55 parts by weight |

Figure 8A:
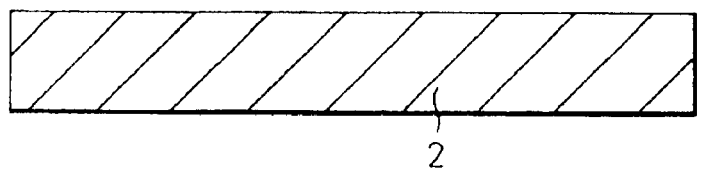
FIGS. 8A through 8G are cross-sectional views showing the order of the steps of a method for producing a crystal vibrator of the present invention by a single product production system.

Green sheets having a thickness of 130 $\mu$m are formed from this slurry using the doctor blade method. Four green sheets are laminated and baked for about 1 hour at about 1550–1650° C. in an oxidizing atmosphere. A plate-like ceramic substrate 2 having a thickness of 400 $\mu$m is obtained as shown in FIG. 8A.

Step (B): Formation of Cavity and Through Hole

Figure 8B:
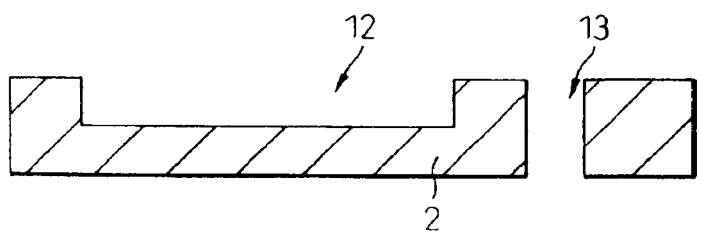
Figure 8C:
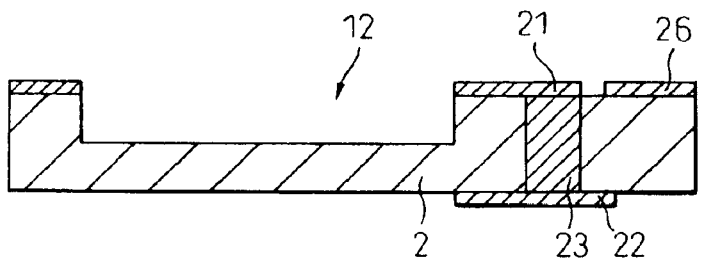

A rectangular cavity 12 like that shown in FIG. 8B is formed by honing in the surface of ceramic substrate 2. In addition, simultaneous to the forming of this cavity 12, a through hole 13 for forming an electrical connection is formed by laser trimming. The hole diameter of through hole 13 is about 150 $\mu$m.

Step (C): Formation of Wiring Layers

After filling Ag/Pd thick film paste into through hole 13, the same Ag/Pd paste is coated onto both the top and bottom surfaces of ceramic substrate 2 in a predetermined pattern. Subsequently, the Ag/Pd thick film paste is baked for about 1 hour at about 850° C. in an oxidizing atmosphere. Wiring layers 21, 22 and 26 along with internal wiring 23 are formed composed of metalized layers.

Step (D): Formation of Plating Layer

Figure 8D:
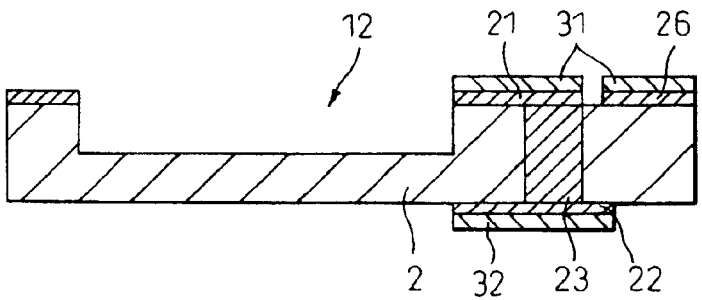

A plating layer is preferably additionally formed on wiring layers 21, 22 and 26 formed from metalized layers as described above. In FIG. 8D, an electroless Ni plating layer 31 having a thickness of 3 µm and an electroless Au plating layer 32 having a thickness of 0.5 µm were formed. These plating layers are effective for protecting the brazed surfaces and joined surfaces from corrosion during processing as well as improving the wettability with the low-temperature metal brazing material. Furthermore, in the following steps, the explanation uses the example of a ceramic substrate not having these plating layers.

Step (E): Mounting of Crystal Resonator

Figure 8E:
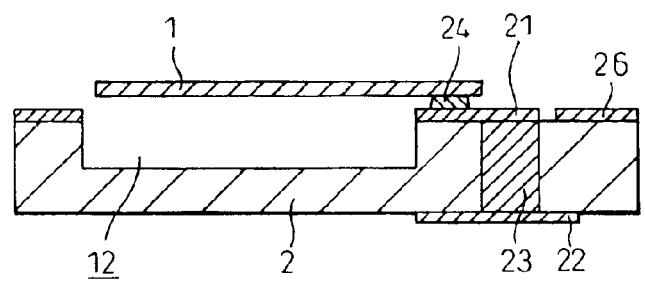

As shown in FIG. 8E, a crystal resonator 1 is mounted on wiring layer 21 of ceramic substrate 2. A conductive paste (thermosetting resin containing Ag) 24 is coated at a prescribed site on wiring layer 21 and on one end of crystal resonator 1, followed by curing treatment at about 180° C. Furthermore, the frequency of the crystal vibrator is adjusted at this stage.

Step (F): Formation of Junction Layer

Figure 8F:
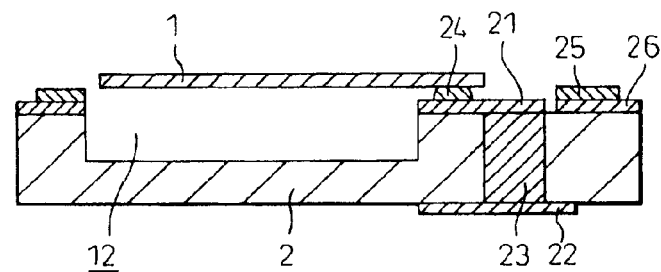

As shown in FIG. 8F, a junction layer 25 is formed by arranging a low-temperature metal brazing material (Au-Sn brazing material) at the position where the lid member joins ceramic substrate 2.

Step (G): Welding of Ceramic Substrate and Lid Member

Figure 8G:
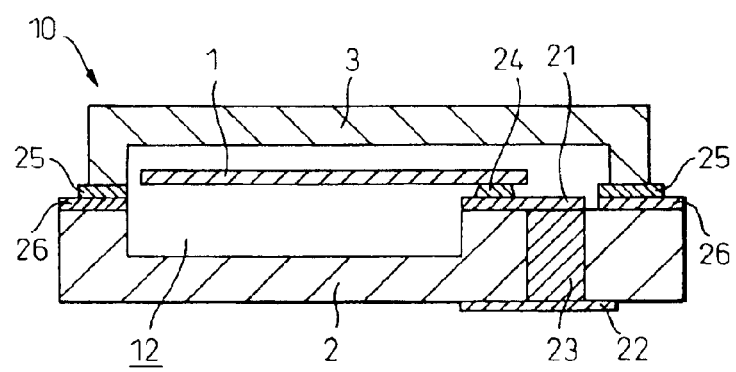

Ceramic substrate 2 and lid member 3 made of kovar (Fe/Ni/Co alloy) are welded by brazing via junction layer 25. As shown in FIG. 8G, crystal vibrator 10 is obtained that is sealed to be completely airtight.

In addition, in the series of production steps described above, if glass (insulating material) is used instead of kovar for the material of the lid member, and the ceramic substrate and lid member are welded via low melting point glass, crystal vibrator 10 is obtained as schematically shown in FIG. 5. Finally, final inspections are performed on this crystal vibrator 10.

INDUSTRIAL APPLICABILITY

As has been explained above, according to the present invention, when producing an electronic device such as a crystal vibrator, crystal oscillator or semiconductor device, costs can be reduced by forming the housing that houses its electronic elements from ceramics.

In addition, according to the present invention, since a multiple production system can be employed for the production of electronic devices, a large number of electronic devices can be produced all at once in fewer steps and at good yield, and there is no occurrence of defects caused by ceramics shrinkage at that time.

Moreover, in the case of forming a large number of cavities on a ceramic substrate, although it had been difficult to carry out subsequent steps such as mounting of electronic elements and sealing of a lid member due to variations in the shape and position of the metal wiring, this difficulty is not encountered in the present invention. In addition, although even greater positional accuracy is required in the case of forming hyperfine wires within a housing in order to accommodate high-density IC mounting and so forth, this requirement can also be satisfied by the present invention.

Moreover, according to the present invention, since unit substrates cut away from a ceramic substrate fulfill the role of a conventional jig, there is no entrance of cuttings or debris into the cavities opened in the ceramic substrate during the production process of an electronic device.

In addition, although the dimensional accuracy of cavities was low in the prior art, and a foil-like low-temperature metal brazing material had to be used as a thick film to compensate for its variation, this disadvantage is not encountered in the present invention.

What is claimed is:

1. A method for producing an electronic device comprising a housing composed of an insulating ceramic substrate and a lid member covering a surface of the ceramic substrate, with at least one electronic element being mounted inside the housing; comprising:

a step wherein, after preparing a plate-like ceramic substrate by baking a composite containing inorganic powders and a binder, a shaped ceramic substrate is formed by shaping the ceramic substrate in accordance with a predetermined design of the device, a step wherein a metalized layer is formed on a surface of the shaped ceramic substrate, a step wherein an electronic element is mounted in a predetermined area of the shaped ceramic substrate, and a step wherein the ceramic substrate having mounted thereon the electronic element is sealed with the lid member.

2. The method for producing an electronic device according to claim 1, wherein the metalized layer is also formed on the area of the surface of the shaped ceramic substrate that is contacted with the lid member.

3. A method for producing an electronic device according to claim 1, wherein the metalized layer is formed by coating a thick film conductive paste on a surface of the ceramic substrate followed by baking.

4. A method for producing an electronic device according to claim 1, wherein in the shaping step, at least one through hole that passes through the substrate and/or at least one cavity for loading an electronic element are formed at a predetermined location of the ceramic substrate.

5. A method for producing an electronic device according to claim 4, wherein electrical connections are formed for connecting the electronic element with an external element and so forth by carrying out metalization by filling a thick film conductive paste into the through holes followed by baking.

6. A method for producing an electronic device according to any one of claims 3 to 5, wherein a paste having Ag for its main ingredient is used for the thick film conductive paste.

7. A method for producing an electronic device according to claim 1, wherein a plating layer is additionally formed on the metalized layer.

8. A method for producing an electronic device according to claim 1, wherein sealing by the lid member is carried out via a junction layer composed of a low-temperature metal brazing material or low melting point glass formed on a surface of the ceramic substrate.

9. A method for producing an electronic device according to claim 8, wherein Au—Sn alloy, Au—Ge alloy, Au—Si alloy or Ag-Ge alloy foil or paste is used for the low-temperature metal brazing material.

10. A method for producing an electronic device according to claim 1, wherein a crystal resonator is used for the electronic element.

11. A method for producing an electronic device comprising a housing composed of an insulating ceramic substrate and a lid member covering a surface of the ceramic substrate, with at least one electronic element being mounted inside the housing; comprising:

a step wherein, after preparing a large, plate-like ceramic substrate, having a size capable of ultimately supplying a plurality of the electronic devices, by baking a composite containing inorganic powders and a binder, a large, shaped ceramic substrate is formed by shaping the large ceramic substrate in accordance with a predetermined design of the device, a step wherein a metalized layer is formed on a surface of the large, shaped ceramic substrate, a step wherein electronic elements are mounted in a predetermined area of the large, shaped ceramic Substrate, a step wherein a plurality of electronic devices are produced by sealing the large ceramic substrate having mounted thereon the electronic elements, with the lid member, and a step wherein the electronic devices are individually separated from the large ceramic substrate.

12. A method for producing an electronic device according to claim 11, wherein the metalized layer is also formed on the area of the surface of the large, shaped ceramic substrate that is contacted with the lid member.

13. A method for producing an electronic device according to claim 11, wherein the metalized layer is formed by coating a thick film conductive paste on a surface of the large ceramic substrate followed by baking.

14. A method for producing an electronic device according to claim 11, wherein in the shaping step, at least one through hole that passes through the substrate and/or at least one cavity for loading an electronic element are formed at a predetermined location of the large ceramic substrate.

15. A method for producing an electronic device according to claim 14, wherein electrical connections are formed for connecting the electronic element with an external element and so forth by carrying our metalization by filling a thick film conductive paste into the through holes followed by baking.

16. A method for producing an electronic device according to any one of claims 13 to 15, wherein a paste having Ag for its main ingredient is used for the thick film conductive paste.

17. A method for producing an electronic device according to claim 11, wherein a plating layer is additionally formed on the metalized layer.

18. A method for producing an electronic device according to claim 11, wherein sealing by the lid member is carried out via a junction layer composed of a low-temperature metal brazing material or low melting point glass formed on a surface of the large ceramic substrate.

19. A method for producing an electronic device according to claim 18, wherein Au—Sn alloy, Au—Ge alloy, Au—Si alloy or Ag-Ge alloy foil or paste is used for the low-temperature metal brazing material.

20. A method for producing an electronic device according to claim 11, wherein a crystal resonator is used for the electronic element.

21. A method for producing an electronic device comprising a housing composed of an insulating ceramic substrate and a lid member covering a surface of the ceramic substrate, with at least one electronic element being mounted inside the housing; comprising:

a step wherein, after preparing a large, plate-like ceramic substrate, having a size capable of ultimately supplying a plurality of the electronic devices, by baking a composite containing inorganic powders and a binder, a shaped ceramic substrate is formed by framing unit substrates within the large ceramic substrate and shaping each of the unit substrates in accordance with a predetermined design of the device, a step wherein the unit substrates are cut away from the large ceramic substrate, a step wherein a metalized layer is formed on a surface of the unit substrates, a step wherein an electronic element is mounted in a predetermined area of the unit substrates, a step wherein electronic devices are produced by sealing the unit substrates in which the electronic element is mounted with the lid member, and a step wherein the electronic devices are individually separated from the unit substrates.

22. A method or producing an electronic device according to claim 21, wherein the unit substrates are framed by providing provisional reference positions at a portion of the large ceramic substrate.

23. A method for producing an electronic device according to claim 21 or 22, wherein a plurality of the unit substrates are framed within the large ceramic substrate.

24. A method for producing an electronic device according to claim 21, wherein the metalized layer is also formed on an area of the surface of the unit substrates that is contacted with the lid member.

25. A method for producing an electronic device according to claim 21, wherein the metalized layer is formed by coating a thick film conductive paste on a surface of the unit substrates followed by baking.

26. A method for producing an electronic device according to claim 21, wherein in the shaping step, at least one through hole that passes though the substrate and/or at least one cavity for loading an electronic element are formed at a predetermined location of the unit substrates.

27. A method for producing an electronic device according to claim 26, wherein electrical connections are formed for connecting the electronic element with an external element and so forth by carrying out metalization by filling a thick film conductive paste into the through holes followed by baking.

28. A method for producing an electronic device according to claims 25 to 27, wherein a paste having Ag for its main ingredient is used for the thick film conductive paste.

29. A method for producing an electronic device according to claim 21, wherein a plating layer is additionally formed on the metalized layer.

30. A method for producing an electronic device according to claim 21, wherein sealing by the lid member is carried out via a junction layer composed of a low-temperature metal brazing material or low melting point glass formed on a surface of the unit substrates.

31. A method for producing an electronic device according to claim 30, wherein Au—Sn alloy, Au—Ge alloy, Au—Si alloy or Ag-Ge alloy foil or paste is used for the low-temperature metal brazing material.

32. A method for producing an electronic device according to claim 21, wherein a crystal resonator is used for the electronic element.

33. An electronic device comprising a housing composed of an insulating ceramic substrate and a lid member covering a surface of the ceramic substrate, with at least one electronic element being mounted inside the housing; wherein, the ceramic substrate of the housing is composed of a plate-like ceramic substrate formed by baking a composite containing inorganic powders and a binder, the ceramic substrate is provided with at least one electrical connection for connecting the electronic element with an external element and so forth, the electrical connection is formed by metalization by filling a thick film conductive paste into a through hole formed by shaping that passes through the ceramic substrate after baking the ceramic substrate followed by baking, a metalizing layer is provided on a surface of the ceramic substrate that is formed by baking the thick film conductive paste after baking the ceramic substrate, and the ceramic substrate and lid member are welded through a junction layer composed of a low-temperature metal brazing material or low melting point glass formed on the ceramic substrate.

34. An electronic device according to claim 33, wherein the electronic element is mounted in a cavity formed by shaping the ceramic substrate after baking the ceramic substrate.

35. An electronic device according to claim 33 or claim 34, wherein the thick film conductive paste is composed of a paste having Ag for its main ingredient.

36. An electronic device according to any one of claims 33 to 35, wherein a plating layer is additionally provided on the metalized layer.

37. An electronic device according to claim 33 or 34, wherein the low-temperature metal brazing material is an Au—Sn alloy, Au—Ge alloy. Au—Si alloy or Ag-Ge alloy in the form of a foil or paste.

38. An electronic device according to claim 33 or 34, wherein the electronic element is a crystal resonator.

* * * * *